United States Patent
Yamada

(10) Patent No.: US 7,518,900 B2
(45) Date of Patent: Apr. 14, 2009

(54) MEMORY

(75) Inventor: Kouichi Yamada, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 166 days.

(21) Appl. No.: 11/489,535

(22) Filed: Jul. 20, 2006

(65) Prior Publication Data

US 2007/0019459 A1 Jan. 25, 2007

(30) Foreign Application Priority Data

Jul. 22, 2005 (JP) ............... 2005-213225

(51) Int. Cl.
*G11C 17/00* (2006.01)
(52) U.S. Cl. ............... 365/103; 365/105; 365/115; 365/185.13; 365/243
(58) Field of Classification Search ............... 365/103, 365/105, 115, 243, 185.15, 185.13
See application file for complete search history.

(56) References Cited

U.S. PATENT DOCUMENTS 4,920,516 A * 4/1990 Tsuchimoto ............. 365/203
5,737,259 A * 4/1998 Chang ............... 365/105
5,843,824 A * 12/1998 Chou et al. ............. 438/278
5,905,670 A * 5/1999 Babson et al. ............ 365/105
5,920,499 A * 7/1999 Chang ............... 365/105
2004/0202041 A1 10/2004 Hidenori

FOREIGN PATENT DOCUMENTS

JP 05-275656 A 10/1993

OTHER PUBLICATIONS

Chinese Office Action issued in Patent Application No. 200610107803.2 dated on Apr. 11, 2008.

* cited by examiner

*Primary Examiner*—Pho M. Luu
(74) *Attorney, Agent, or Firm*—McDermott Will & Emery LLP

(57) ABSTRACT

A memory capable of reducing the memory cell size is provided. This memory includes a plurality of memory cells including diodes, a plurality of bit lines and a first conductive type first impurity region arranged to intersect with the bit lines for functioning as first electrodes of the diodes included in the memory cells and a word line. The first impurity region is divided every bit line group formed by a prescribed number of bit lines along a direction intersecting with the extensional direction of the first impurity region.

17 Claims, 6 Drawing Sheets

MEMORY

BACKGROUND OF THE INVENTION

1. Field of the Invention

The present invention relates to a memory, and more particularly, it relates to a memory such as a mask ROM.

2. Description of the Background Art

A mask ROM disclosed in Japanese Patent Laying-Open No. 5-275656 (1993) is generally known as an exemplary memory.

FIG. 8 is a plane layout diagram showing the structure of a conventional contact-mask ROM. Referring to FIG. 8, a plurality of word lines 101 and a plurality of bit lines 102 are arranged to intersect with each other in the conventional contact-mask ROM. Memory cells 104 formed by single transistors 103 respectively are arranged on positions corresponding to the intersections between the plurality of word lines 101 and the plurality of bit lines 102 respectively. The word lines 101 are formed on a substrate (not shown) through gate insulating films (not shown) of the transistors 103. These word lines 101 function also as gate electrodes of the transistors 103. On a surface portion of the substrate (not shown) located on the region formed with each memory cell 104, a pair of impurity regions 105 and 106 serving as source/drain regions of the corresponding transistor 103 are formed to hold a region located under the corresponding word line 101 therebetween.

Source lines (GND lines) 107 are provided on the impurity regions 105 functioning either the source regions or the drain regions of the transistors 103, to extend along the extensional direction of the word lines 101. The source lines 107 and the impurity regions 105 are connected with each other through plugs 108. Thus, the impurity regions 105 are supplied with the ground potential (GND). The conventional mask ROM sets data of each memory cell 104 including the transistor 103 to "0" or "1" depending on whether or not the impurity region 106 functioning as either the drain region or the source region of the transistor 103 is connected to the corresponding bit line 102.

In the conventional mask ROM shown in FIG. 8, however, the memory cell size is disadvantageously increased due to the transistors 103 provided in correspondence to the respective memory cells 104.

SUMMARY OF THE INVENTION

The present invention has been proposed in order to solve the aforementioned problem, and an object of the present invention is to provide a memory capable of reducing the memory cell size.

In order to attain the aforementioned object, a memory according to an aspect of the present invention comprises a plurality of memory cells including diodes, a plurality of bit lines and a first conductive type first impurity region arranged to intersect with the bit lines for functioning as first electrodes of the diodes included in the memory cells and a word line. The first impurity region is divided every bit line group formed by a prescribed number of bit lines.

In the memory according to this aspect, as hereinabove described, the memory cells so include the diodes that a crosspoint memory cell array can be formed by arranging the diodes included in the memory cells in the form of a matrix (crosspoint). In this case, each memory cell includes a single diode, whereby the memory cell size can be reduced as compared with a case where each memory cell includes a single transistor. Further, the first impurity region functioning as the word line is so divided every bit line group formed by the prescribed number of bit lines that resistance of the word line can be inhibited from increase resulting from an increased length of the first impurity region, whereby reduction of the rate of fall (rise) of the word line can be suppressed.

In the memory according to the aforementioned aspect, the plurality of memory cells are preferably arranged on the intersections between the divided first impurity region and the plurality of bit lines respectively, and the memory cells arranged on the intersections between the prescribed number of bit lines included in a prescribed bit line group and the first impurity region corresponding to the prescribed bit line group preferably constitute a memory cell block, so that the memory supplies a first potential to the first impurity region corresponding to a selected memory cell in the memory cell block including the selected memory cell while supplying a second potential to the first impurity region other than the first impurity region corresponding to the selected memory cell in the memory cell block including the selected memory cell when accessing the selected memory cell. According to this structure, the memory can apply a high-level potential to the bit line corresponding to the selected memory cell while supplying a low-level potential as the first potential to the first impurity region, corresponding to the selected memory cell in the memory cell block including the selected memory cell and functioning as the cathode of the diode of this memory cell for example, and supplying the high-level potential as the second potential to the nonselected first impurity region other than the first impurity region corresponding to the selected memory cell in the memory cell block including the selected memory cell, so that no current substantially flows between the cathodes of the diodes of nonselected memory cells, linked to the selected bit line, included in the memory cell block including the selected memory cell and the bit line. Thus, the memory can suppress such inconvenience that the same cannot determine data of the selected memory cell until currents of all nonselected memory cells linked to the selected bit line completely flow when the anode of the diode of the selected memory cell and the bit line are not connected with each other. Consequently, the data read time can be reduced.

In this case, the memory preferably further comprises a selection transistor provided every divided first impurity region for selecting the first impurity region corresponding to the memory cell block including the selected memory cell and supplying the first potential or the second potential, while the first impurity region preferably functions as either the source region or the drain region of the selection transistor. According to this structure, the memory can easily select the first impurity region corresponding to the memory cell block including the accessed memory cell and supply the first or second potential with the selection transistor. Further, the first impurity region functions also as either the source region or the drain region of the selection transistor so that the source or drain region of the selection transistor may not be separately formed, whereby the layout of the memory can be simplified.

In the aforementioned structure including the selection transistor, the first impurity region preferably includes a first conductive type second impurity region having a first impurity concentration and a first conductive type third impurity region having a second impurity concentration higher than the first impurity concentration, and the second impurity region is preferably formed shallower than the third impurity region to extend toward a portion close to the gate electrode of the selection transistor. According to this structure, the memory can suppress field concentration around the gate electrode with the second impurity region of the low in impurity concentration extending toward the portion close to the gate electrode.

In this case, the memory preferably further comprises a plurality of second conductive type fourth impurity regions formed at least on the surface of the first conductive type second impurity region at a prescribed interval for functioning as second electrodes of the diodes. According to this structure, the diodes formed by the first conductive type second impurity regions and the second conductive type fourth impurity regions can be easily arranged in the form of a matrix (crosspoint).

In the aforementioned structure including the selection transistor, the memory preferably further comprises a fifth impurity region functioning as either the drain region or the source region of the selection transistor and a first wire connected to the fifth impurity region for supplying the first potential or the second potential when accessing the memory cell. According to this structure, the memory can supply the first or second potential to the first impurity region through the fifth impurity region functioning as either the drain region or the source region of the selection transistor and a channel region of the selection transistor from the first wire by turning on the selection transistor when accessing the memory cell, thereby easily selecting the first impurity region corresponding to the memory cell block including the selected memory cell and supplying the first or second potential when accessing the memory cell.

In the aforementioned structure including the first wire, the first wire is preferably so formed as to extend along the extensional direction of the first impurity region. According to this structure, the first wire can be easily connected to the source/drain regions of the selected transistor also when the selection transistor is formed in the vicinity of both ends of the first impurity region.

In this case, the first wire is preferably formed above the bit lines. According to this structure, the first wire can be easily formed to extend along the extensional direction of the first impurity region.

In the aforementioned structure including the fifth impurity region, the fifth impurity region preferably includes a first conductive type sixth impurity region having a third impurity concentration and a first conductive type seventh impurity region having a fourth impurity concentration higher than the third impurity concentration, and the sixth impurity region is preferably formed shallower than the seventh impurity region to extend toward a portion close to the gate electrode of the selection transistor. According to this structure, the memory can suppress field concentration around the gate electrode with the sixth impurity region of the low impurity concentration extending toward the portion close to the gate electrode.

In this case, the seventh impurity region is preferably formed with a first conductive type contact region for reducing contact resistance between the seventh impurity region and the first wire. According to this structure, the memory can suppress reduction of the rate of fall (rise) of the word line resulting from increased contact resistance.

In the aforementioned structure having the fifth impurity region including the seventh impurity region, the first impurity region may include a first conductive type second impurity region having a first impurity concentration and a first conductive type third impurity region having a second impurity concentration higher than the first impurity concentration, and the fourth impurity concentration of the seventh impurity region may be higher than the second impurity concentration of the third impurity region.

In the aforementioned structure including the fifth impurity region, the selection transistor preferably includes a first selection transistor and a second selection transistor for selecting two adjacent first impurity regions respectively, and the first selection transistor and the second selection transistor preferably share the fifth impurity region. According to this structure, the fifth impurity region can be employed as either the drain region or the source region common to the first and second selection transistors so that the drain or source regions of the first and second selection transistors may not be individually formed. Thus, the layout of the memory can be simplified also according to this structure.

In this case, the memory preferably further comprises a first gate line provided to extend along a direction intersecting with the extensional direction of the first impurity region for functioning as a common gate electrode of a plurality of first selection transistors provided in correspondence to a prescribed memory cell block and a second gate line provided to extend along the direction intersecting with the extensional direction of the first impurity region for functioning as a common gate electrode of a plurality of second selection transistors provided in correspondence to the memory cell block adjacent to the prescribed memory cell block, for activating the corresponding memory cell block by supplying a block selection signal to the first gate line or the second gate line thereby turning on the corresponding first selection transistors or the corresponding second selection transistors. According to this structure, the memory can easily selectively activate only the memory cell block including the selected memory cell by supplying the block selection signal to the first or second gate line. Further, the first and second gate lines are provided in common to the plurality of first selection transistors and the plurality of second selection transistors respectively, whereby the memory can simultaneously turn on the plurality of first selection transistors or the plurality of second selection transistors by applying the block selection signal to the first or second gate line when accessing the memory cell. Thus, the memory may not individually turn on the plurality of first selection transistors or the plurality of second selection transistors, whereby control of the plurality of first selection transistors or the plurality of second selection transistors can be simplified.

In the aforementioned structure including the selection transistor and the first wire, the selection transistor preferably includes a third selection transistor and a fourth selection transistor formed in the vicinity of both ends of the extensional direction of the first impurity region to hold the first impurity region therebetween. According to this structure, the memory can easily supply the first or second potential to the first impurity region through the third and fourth selection transistors formed in the vicinity of both ends of the first impurity region from the first wire.

In this case, the memory preferably further comprises a third gate line provided to extend along a direction intersecting with the extensional direction of the first impurity region for functioning as a common gate electrode of a plurality of third selection transistors provided in correspondence to a prescribed memory cell block and a fourth gate line provided to extend along the direction intersecting with the extensional direction of the first impurity region for functioning as a common gate electrode of a plurality of fourth selection transistors provided in correspondence to the prescribed memory cell block, for activating the prescribed memory cell block by supplying a block selection signal to the third gate line and the fourth gate line thereby turning on the corresponding third selection transistors and the corresponding fourth selection transistors. According to this structure, the memory can easily selectively activate only the memory cell block including the selected memory cell by supplying the block selection signal to the third and fourth gate lines. Further, the third and fourth gate lines are provided in common to the plurality of third selection transistors and the plurality of fourth selection transistors respectively, whereby the memory can simultaneously turn on the plurality of third selection transistors and the plurality of fourth selection transistors by applying the block selection signal to the third and fourth gate lines when accessing the memory cell. Thus, the memory may not individually turn on the plurality of third selection transistors and the plurality of fourth selection transistors, whereby control of the plurality of third selection transistors and the plurality of fourth selection transistors can be simplified.

In the aforementioned structure including the fourth impurity region, the memory preferably further comprises a second wire connected to the fourth impurity region, while the memory cells preferably include a first memory cell having a third wire for connecting the second wire and the bit lines with each other and a second memory cell having no third wire. According to this structure, the first and second memory cells can hold different data respectively.

The memory according to the aforementioned aspect preferably further comprises a bit line selection transistor connected to the bit lines, for turning on the bit line selection transistor connected to the corresponding one of the bit lines connected with a selected memory cell when accessing the selected memory cell. According to this structure, the memory can output a data signal corresponding to data of the selected memory cell.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the drawings. In the following description of the embodiment, the present invention is applied to a mask ROM utilizing a diode matrix (hereinafter referred to as a diode ROM) as an exemplary memory.

Figure 1:
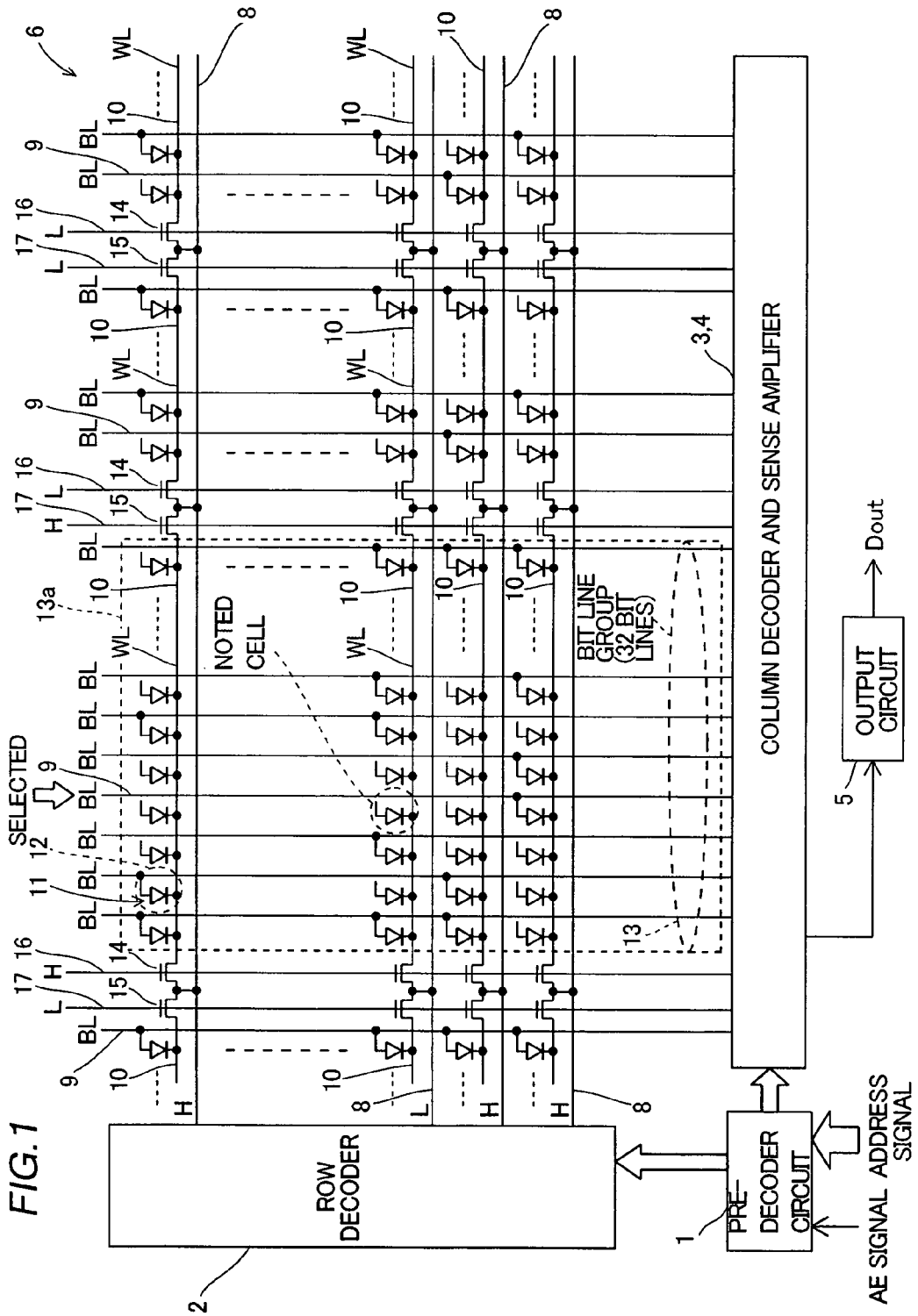
FIG. 1 is a circuit diagram showing the structure of a diode ROM according to an embodiment of the present invention.

FIG. 1 is a circuit diagram showing the structure of the diode ROM according to the embodiment of the present invention. The overall structure of the diode ROM according to the embodiment of the present invention is now described with reference to FIG. 1.

As shown in FIG. 1, the diode ROM according to this embodiment comprises a predecoder circuit 1, row decoders 2, column decoders 3, sense amplifiers 4, output circuits 5 and a memory cell array 6. The predecoder circuit 1 is so formed as to receive an external address signal and an external address enable (AE) signal thereby outputting a predecoding signal for selecting a prescribed address to each row decoder 2, each column decoder 3 and each sense amplifier 4.

A plurality of (1024) global word lines 8 linked to a plurality of word lines (WL) 10 described later are connected to the row decoders 2. The global word lines 8 are examples of the "first wire" in the present invention. Each row decoder 2 selects the global word line 8 corresponding to the address indicated by the predecoding signal received from the predecoder circuit 1. Each row decoder 2 is so formed as to supply a low-level potential to the selected global word line 8 while supplying a high-level potential to the nonselected global word lines 8 at this time. A plurality of (2048) bit lines (BL) 9 are connected to the column decoders 3. Each column decoder 3 is so formed as to select the bit line 9 corresponding to the address indicated by the predecoding signal received from the predecoder circuit 1 and to connect the selected bit line 9 with the corresponding sense amplifier 4. Each column decoder 3 also has a function of selecting a divided word line 10, described later, corresponding to the predecoding signal received from the predecoder circuit 1. Each sense amplifier 4 is so formed as to determine and amplify the potential of the bit line 9 selected by the corresponding column decoder 3 for thereafter outputting a high-level signal when the potential of the selected bit line 9 is at a low level while outputting a low-level signal when the potential of the selected bit line 9 is at a high level. Each output circuit 5 is so formed as to receive the signal from the corresponding sense amplifier 4 and to output a signal Dout responsive to the signal received from the sense amplifier 4.

The plurality of bit lines (BL) 9 and the plurality of word lines (WL) 10 are provided on the memory cell array 6 to intersect with each other. Memory cells 12 formed by single diodes 11 respectively are arranged on positions corresponding to the intersections between the plurality of bit lines 9 and the plurality of word lines 10 respectively. Thus, the memory cell array 6 has a crosspoint structure formed by the memory cells 12 arranged in the form of a matrix. Each sense amplifier 4 reads data of the corresponding memory cells 12 through the corresponding bit line 9 and the corresponding column decoder 3. The memory cells 12 provided on the memory cell array 6 include those having the diodes 11 whose anodes are connected to the corresponding bit lines 9 and those having the diodes 11 whose anodes are not connected to the corresponding bit lines 9. The diode ROM sets data held in each memory cell 12 to "0" or "1" depending on whether or not the anode of the diode 11 thereof is connected to the corresponding bit line 9.

The memory cell array 6 is provided with 64 bit line groups 13, each constituted of 32 bit lines 9. The word lines 10 are provided to extend along the extensional direction of the global word lines 8 connected to the row decoders 2. The word lines 10 are divided every region corresponding to each bit line group 13. Thus, 32 bit lines 9 intersect with each divided word line 10, so that 32 memory cells 12 (diodes 11)

are arranged on the intersections between each divided word line 10 and the corresponding 32 bit lines 9. Further, 32768 (=32×1024) memory cells 12 arranged on the intersections between 32 bit lines 9 included in each bit line group 13 and 1024 divided word lines 10 corresponding to this bit line group 13 constitute each memory cell block 13a.

A pair of word line selection transistors 14 and 15 for selecting each word line 10 are provided on both ends of each divided word line 10. The pair of word line selection transistors 14 and 15 corresponding to a prescribed word line 10 are examples of the "selection transistor" or the "first selection transistor" in the present invention, and the pair of word line selection transistors 14 and 15 corresponding to another word line 10 adjacent to the prescribed word line 10 are examples of the "selection transistor" or the "second selection transistor" in the present invention. Further, the word line selection transistors 14 and 15 are examples of the "third selection transistor" and the "fourth selection transistor" in the present invention respectively. Either the source regions or the drain regions of each pair of word line selection transistors 14 and 15 are connected to first and second ends of the corresponding divided word line 10 respectively. Further, either the drain regions or the source regions of the word line selection transistors 14 and 15 provided between each pair of divided word lines 10 adjacent to each other along the extensional direction of the word lines 10 are connected with each other. Thus, each pair of divided word lines 10 adjacent to each other along the extensional direction of the word lines 10 are connected with each other through the corresponding word line selection transistors 14 and 15. The word line selection transistors 14 and 15 are provided to hold 1024 divided word lines 10 provided in correspondence to each memory cell block 13a respectively. Thus, 1024 word line selection transistors 14 and 1024 word line selection transistors 15 are provided in correspondence to each memory cell block 13a.

The gate electrodes of the 1024 word line selection transistors 14 and the 1024 word line selection transistors 15 provided in correspondence to each memory cell block 13a are connected to the corresponding one of gate lines 16 and the corresponding one of gate lines 17 respectively. The gate lines 16 and 17 corresponding to a prescribed memory cell block 13a are examples of the "first gate line" in the present invention, and the gate lines 16 and 17 corresponding to another memory cell block 13a adjacent to the prescribed memory cell block 13a are examples of the "second gate line" in the present invention. Further, the gate lines 16 and 17 are examples of the "third gate line" and the "fourth gate line" in the present invention respectively. The gate lines 16 and 17 are provided to extend along the extensional direction of the bit lines 9, and connected to the column decoders 3. The global word lines 8 linked to the row decoders 2 are connected to either the drain regions or the source regions, connected with each other, of the word line selection transistors 14 and 15. Thus, the diode ROM supplies high- or low-level potentials from the row decoders 2 to either the drain regions or the source regions, connected with each other, of the word line selection transistors 14 and 15 through the global word lines 8.

Figure 2:
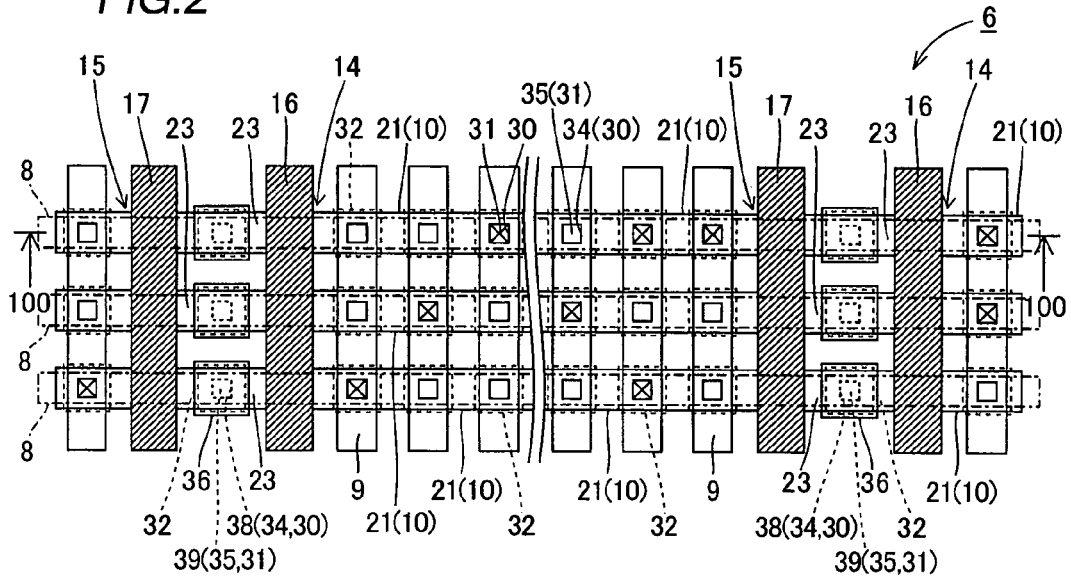
FIG. 2 is a plane layout diagram showing the structure of a memory cell array of the diode ROM according to the embodiment shown in FIG. 1.
Figure 3:
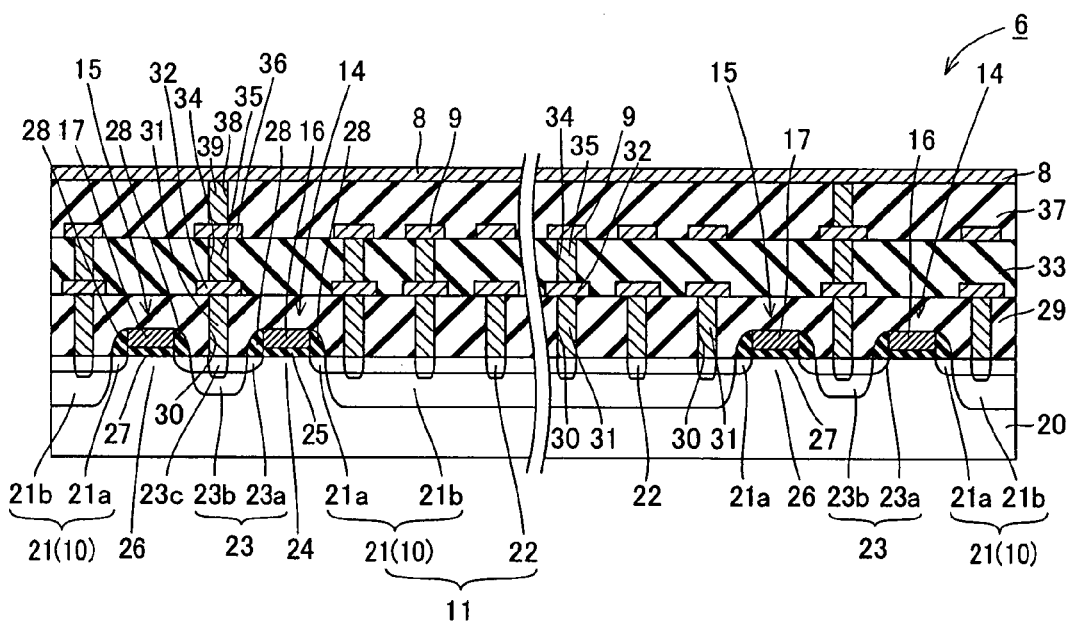
FIG. 3 is a sectional view of the memory cell array of the diode ROM according to the embodiment taken along the line 100-100 in FIG. 2.

FIG. 2 is a plane layout diagram showing the structure of the memory cell array 6 of the diode ROM according to the embodiment shown in FIG. 1. FIG. 3 is a sectional view of the memory cell array 6 of the diode ROM according to the embodiment taken along the line 100-100 in FIG. 2. The structure the memory cell array 6 of the diode ROM according to the embodiment is now described with reference to FIGS. 1 to 3.

As shown in FIGS. 2 and 3, a plurality of n-type impurity regions 21 are provided on the upper surface of a p-type silicon substrate 20 in the memory cell array 6 of the diode ROM according to the embodiment. The plurality of n-type impurity regions 21 are provided at a prescribed interval along the extensional direction of the n-type impurity regions 21, and at another prescribed interval along a direction perpendicular to the extensional direction of the n-type impurity regions 21. The n-type impurity regions 21 are examples of the "first impurity region" in the present invention. As shown in FIG. 3, the n-type impurity regions 21 are constituted of n-type low-concentration impurity regions 21a and n-type impurity regions 21b formed deeper than the impurity regions 21a. The impurity regions 21a and 21b are examples of the "second impurity region" and the "third impurity region" in the present invention respectively. The impurity regions 21b have an n-type impurity concentration slightly higher than that of the impurity regions 21a. The impurity regions 21a are so formed as to extend toward portions close to the gate lines 16 and 17 of the word line selection transistors 14 and 15. The plurality of n-type impurity regions 21 function as the aforementioned divided word lines 10 respectively.

32 p-type impurity regions 22 are formed in each n-type impurity region 21 at a prescribed interval. The p-type impurity regions 22 are examples of the "fourth impurity region" in the present invention. Each p-type impurity region 22 and the corresponding n-type impurity region 21 form each diode 11. Thus, each n-type impurity region 21 functions also as a common cathode of 32 diodes 11. Each p-type impurity region 22 functions as the anode of the corresponding diode 11.

The n-type impurity regions 21 function also as either the source regions or the drain regions of the word line selection transistors 14 and 15. According to this embodiment, the n-type impurity regions 21 are divided on positions corresponding to areas formed with the word line selection transistors 14 and 15, as shown in FIGS. 2 and 3. Impurity regions 23 functioning as either the drain regions or the source regions of the word line selection transistors 14 and 15 are formed on prescribed areas between pairs of n-type impurity regions 21 adjacent to each other along the extensional direction of the n-type impurity regions 21. The impurity regions 23 are examples of the "fifth impurity region" in the present invention. The word line selection transistors 14 provided in correspondence to prescribed n-type impurity regions 21 and the word line selection transistors 15 provided in correspondence to other n-type impurity regions 21 adjacent to the prescribed n-type impurity regions 21 along the extensional direction of the n-type impurity regions 21 share the impurity regions 23.

The impurity regions 23 include n-type low-concentration impurity regions 23a and n-type high-concentration impurity regions 23b. The n-type low-concentration impurity regions 23a and the n-type high-concentration impurity regions 23b are examples of the "sixth impurity region" and the "seventh impurity region" in the present invention respectively. The n-type low-concentration impurity regions 23a are formed on areas relatively shallow with respect to the surface of the p-type silicon substrate 20, while the n-type high-concentration impurity regions 23b are formed up to areas deeper than the n-type low-concentration impurity regions 23a. Further, the n-type low-concentration impurity regions 23a are so formed as to extend toward portions close to the gate lines 16 and 17 of the word line selection transistors 14 and 15. Thus, the impurity regions 23 are in an LDD (lightly doped drain) structure formed by the n-type low-concentration impurity regions 23a and the n-type high-concentration impurity regions 23b. The n-type low-concentration impurity regions 23a and the n-type high-concentration impurity regions 23b of the impurity regions 23 are formed with n-type contact regions 23c. The n-type contact regions 23c are examples of the "contact region" in the present invention. These n-type contact regions 23c are provided for reducing contact resistance upon connection between first-layer plugs 31, described later, and the impurity regions 23. The n-type low-concentration impurity regions 23a of the impurity regions 23 and the impurity regions 21a of the n-type impurity regions 21 are identical in impurity concentration to each other. The n-type high-concentration impurity regions 23b of the impurity regions 23 are higher in impurity concentration than the impurity regions 21b of the n-type impurity regions 21.

The gate lines 16 of polysilicon are formed on channel regions 24 of the word line selection transistors 14 provided between the n-type impurity regions 21 and the impurity regions 23 of the p-type silicon substrate 20 through gate insulating films 25. The gate lines 17 of polysilicon are formed on channel regions 26 of the word line selection transistors 15 provided between the n-type impurity regions 21 and the impurity regions 23 of the p-type silicon substrate 20 through gate insulating films 27. The gate lines 16 and 17 are so formed as to extend in the direction perpendicular to the extensional direction of the n-type impurity regions 21, as shown in FIG. 2.

Side wall spacers 28 formed by insulating films are provided on both sides of the gate lines 16 and 17 respectively, as shown in FIG. 3. A first interlayer dielectric film 29 is provided on the upper surface of the p-type silicon substrate 20, to cover the gate lines 16 and 17 and the side wall spacers 28. Contact holes 30 are provided in areas of the first interlayer dielectric film 29 corresponding to the p-type impurity regions 22 and the n-type contact regions 23c. The contact holes 30 are provided on the positions corresponding to the p-type impurity regions 22 and the n-type contact regions 23c, since the p-type impurity regions 22 and the n-type contact regions 23c are formed by performing ion implantation on the p-type silicon substrate 20 through the contact holes 30. The first-layer plugs 31 of W (tungsten) are embedded in the contact holes 30. Thus, the plugs 31 are connected to the p-type impurity regions 22 and the n-type contact regions 23c. These plugs 31 are examples of the "second wire" in the present invention.

First pad layers 32 of Al are provided on the first interlayer dielectric film 29, to be connected to the first-layer plugs 31. Further, a second interlayer dielectric film 33 is provided on the first interlayer dielectric film 29, to cover the first pad layers 32. Contact holes 34 are formed in areas of the second interlayer dielectric film 33 corresponding to the first pad layers 32. Second-layer plugs 35 of W are embedded in the contact holes 34. These plugs 35 are examples of the "third wire" in the present invention.

The plurality of bit lines 9 of Al and second pad layers 36 are provided on the second interlayer dielectric film 33. The plurality of bit lines 9 are so formed as to extend in the direction perpendicular to the extensional direction of the n-type impurity regions 21. Further, the bit lines 9 are connected to the second-layer plugs 35 linked to the p-type impurity regions 22 (anodes of the diodes 11). The second-layer plugs 35 are provided between the first pad layers 32 linked to prescribed p-type impurity regions 22 (anodes of the corresponding diodes 11) and the corresponding bit lines 9, but not provided between the first pad layers 32 linked to the remaining p-type impurity regions 22 (anodes of the corresponding diodes 11) and the corresponding bit lines 9. Thus, the diodes 11 include those whose anodes are connected to the bit lines 9 and those whose anodes are not connected to the bit lines 9. In other words, the diode ROM according to the present invention sets data of each memory cell 12 (see FIG. 1) including the diode 11 to "0" or "1" depending on whether or not the corresponding contact hole 34 is provided in the second interlayer dielectric film 33. The second pad layers 36 are connected to the second-layer plugs 35.

A third interlayer dielectric film 37 is provided on the second interlayer dielectric film 33, to cover the bit lines 9 and the second pad layers 36. Contact holes 38 are provided in areas of the third interlayer dielectric film 37 corresponding to the second pad layers 36 linked to the n-type contact regions 23c, while third-layer plugs 39 of W are embedded in the contact holes 38. Thus, the third-layer plugs 39 are connected to the second pad layers 36 linked to the n-type contact regions 23c. The plurality of global word lines 8 of Al are provided on areas of the third interlayer dielectric film 37 corresponding to the n-type impurity regions 21 at a prescribed interval. The plurality of global word lines 8 are so formed as to extend along the extensional direction of the n-type impurity regions 21. Further, the global word lines 8 are connected to the third-layer plugs 39. Thus, the global word lines 8 are connected to the impurity regions 23 functioning as the source/drain regions of the word line selection transistors 14 and 15 through the first-layer plugs 31, the first pad layers 32, the second-layer plugs 35, the second pad layers 36 and the third-layer plugs 39.

Figure 4:
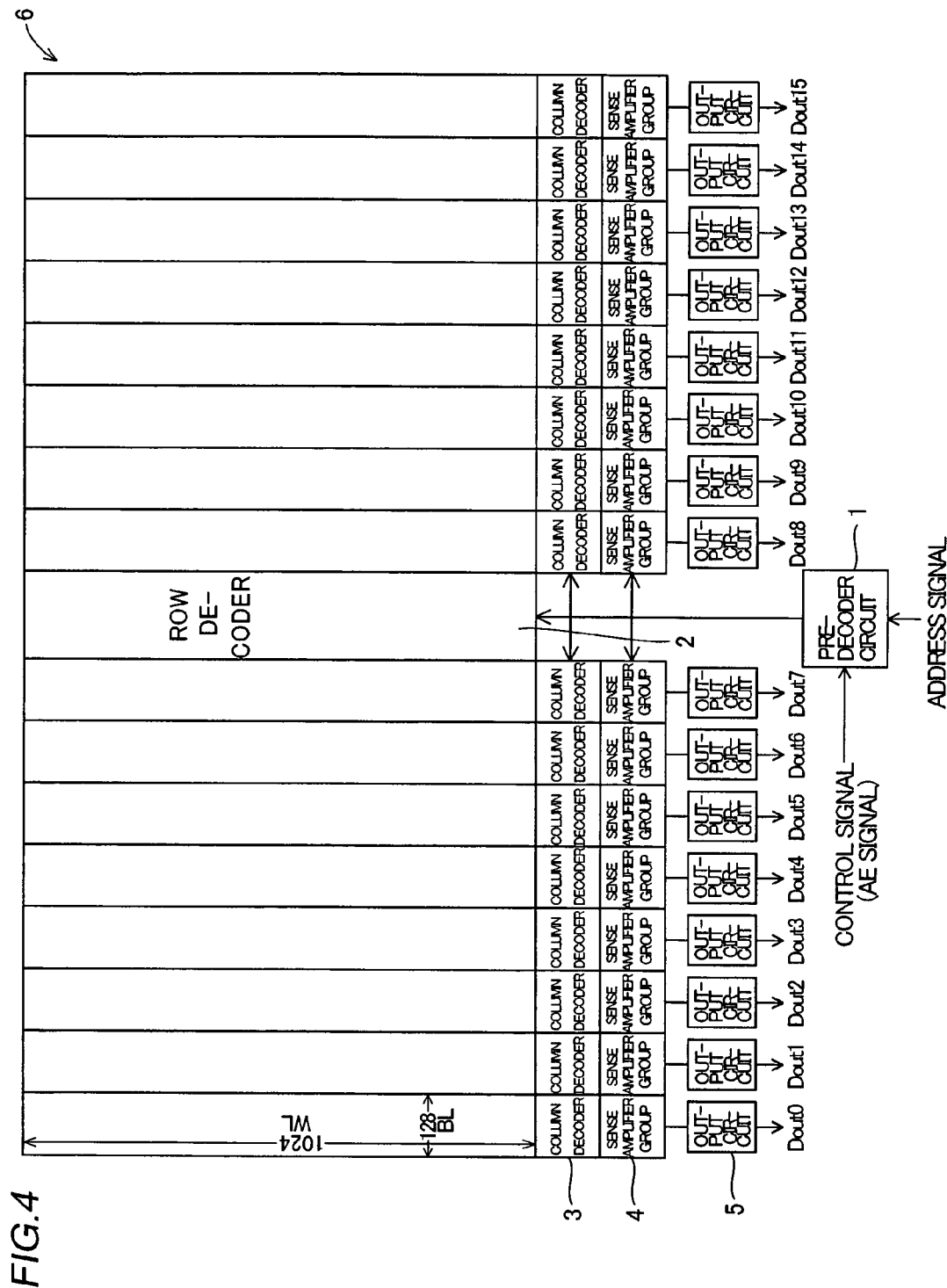
FIG. 4 is a block diagram for illustrating the structures of a predecoder circuit, column decoders, sense amplifiers and output circuits of the diode ROM according to the embodiment shown in FIG. 1.
Figure 5:
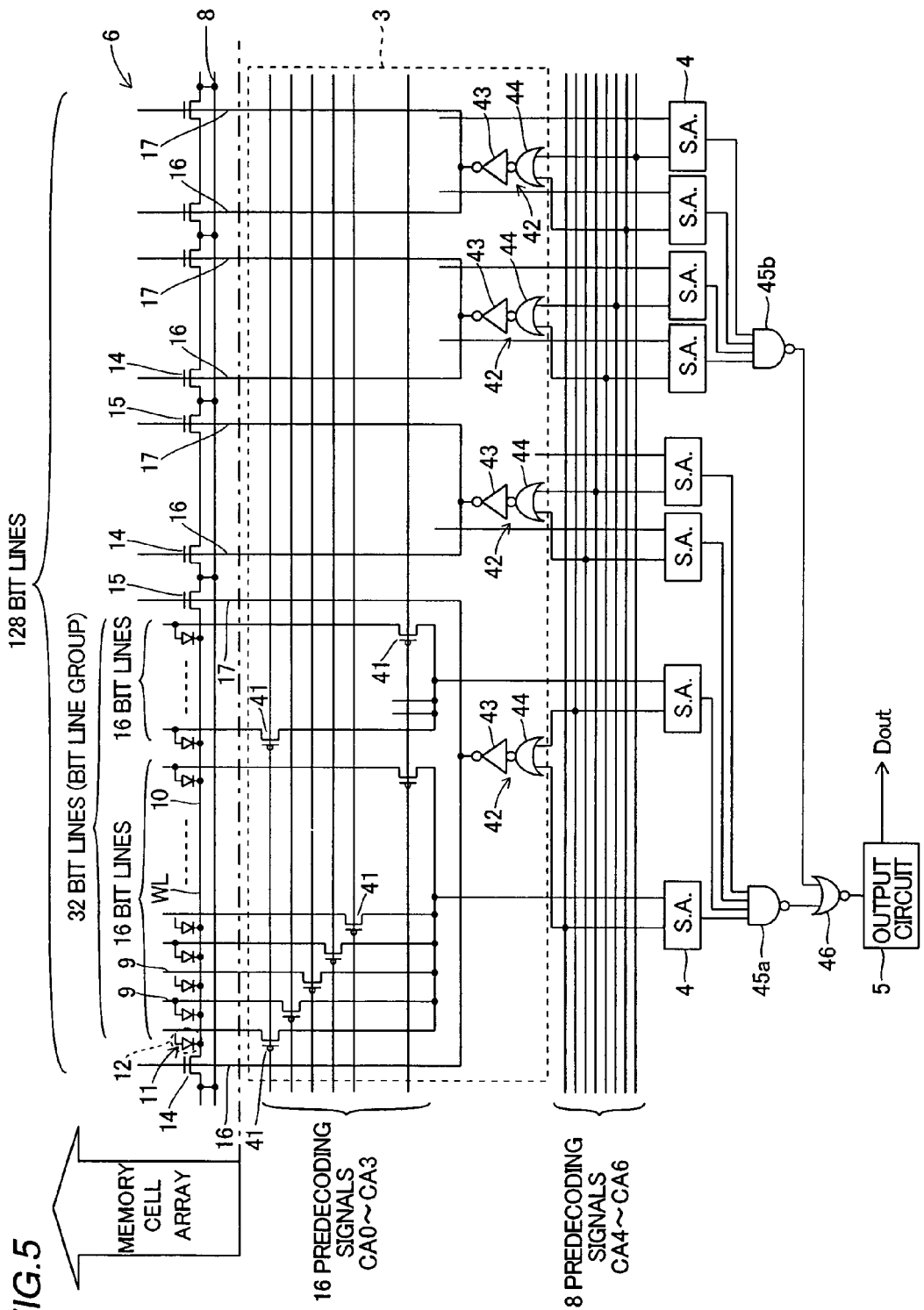
FIG. 5 is a circuit diagram showing the circuit structures of each column decoder, the corresponding sense amplifiers and the corresponding output circuit of the diode ROM according to the embodiment shown in FIG. 4.
Figure 6:
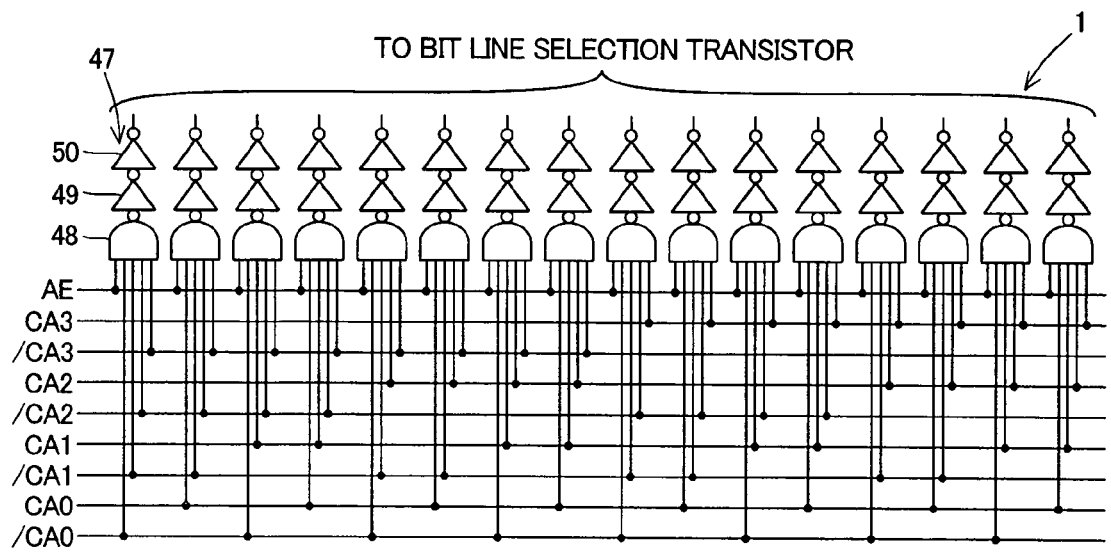
FIGS. 6 and 7 are circuit diagrams showing the circuit structure of the predecoder circuit of the diode ROM according to the embodiment shown in FIG. 4.
Figure 7:
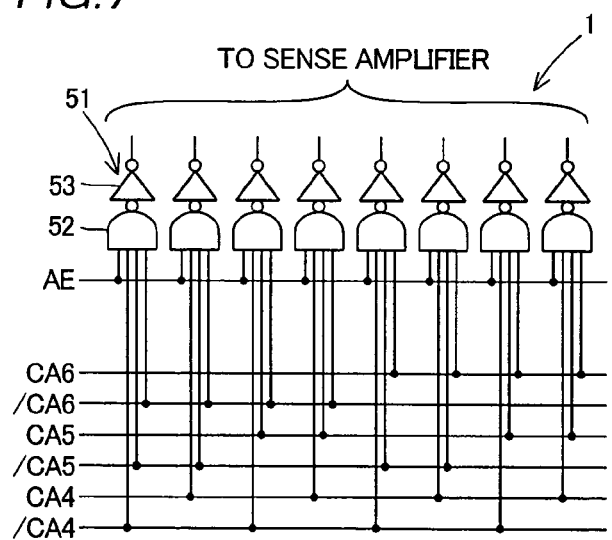
Figure 8:
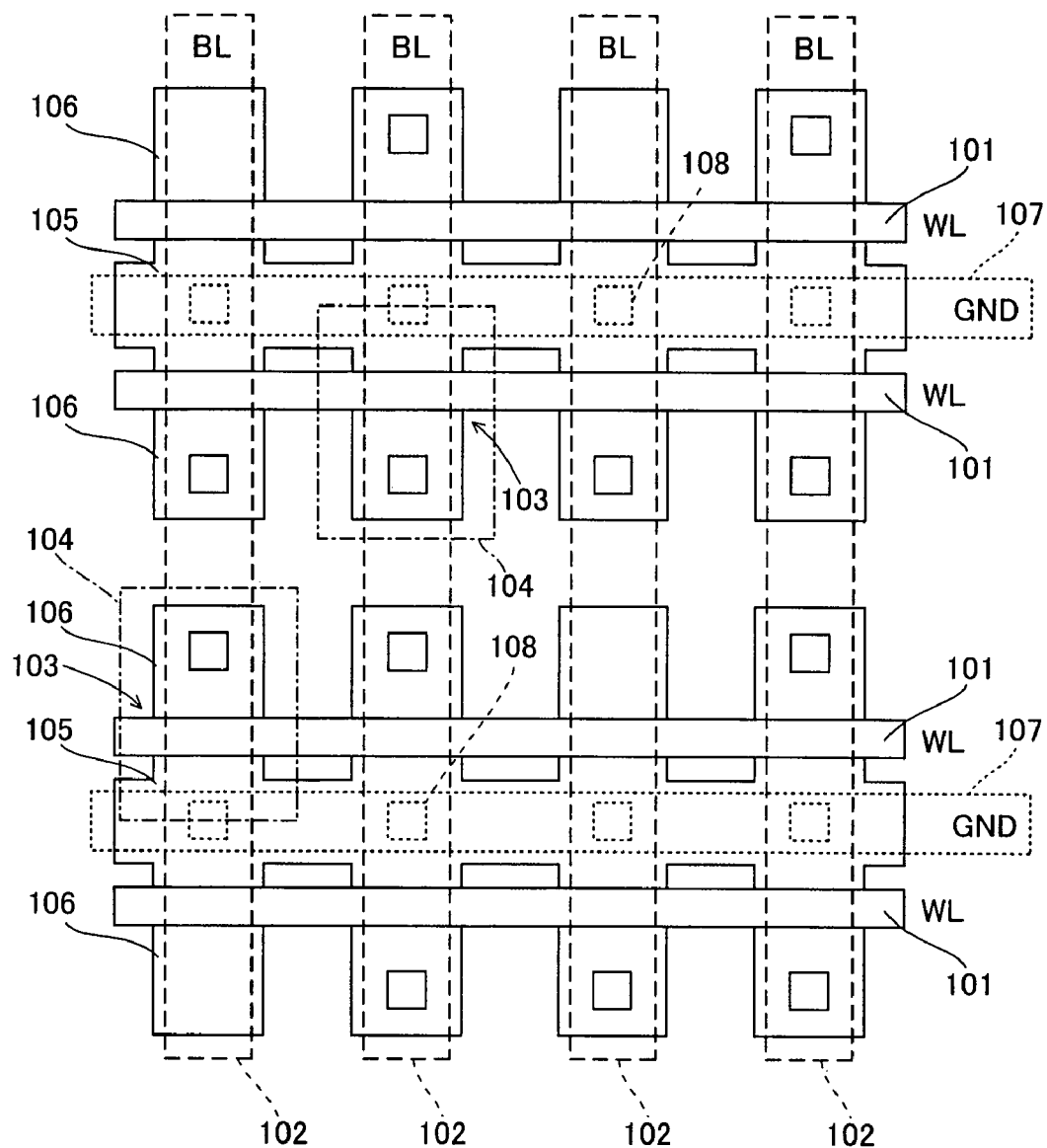
FIG. 8 is a plane layout diagram showing the structure of an exemplary conventional mask ROM.

FIG. 4 is a block diagram for illustrating the structures of the predecoder circuit 1, the column decoders 3, the sense amplifiers 4 and the output circuits 5 of the diode ROM according to the embodiment shown in FIG. 1. FIG. 5 is a circuit diagram showing the circuit structures of each column decoder 3, the corresponding sense amplifiers 4 and the corresponding output circuit 5 of the diode ROM according to the embodiment shown in FIG. 4. FIGS. 6 and 7 are circuit diagrams showing the circuit structure of the predecoder circuit 1 of the diode ROM according to the embodiment shown in FIG. 4. The structures of the predecoder circuit 1, the column decoders 3, the sense amplifiers 4 and the output circuits 5 of the diode ROM according to the embodiment of the present invention are now described in detail with reference to FIGS. 4 to 7.

In the diode ROM according to this embodiment, each output circuit 5 is provided every 128 bit lines 9 as shown in FIG. 4. In other words, the diode ROM is provided with 16 output circuits 5 in total. Each output circuit 5 is so formed as to receive data read through the corresponding 128 bit lines 9 through the corresponding column decoder 3 and the corresponding sense amplifier 4. The output circuits 5 are so formed as to output signals Dout0 to Dout15 corresponding to the received data respectively. According to this embodiment, each of 16 circuit portions formed by the column decoders 3, the sense amplifiers 4 and the output circuits 5 has a circuit structure shown in FIG. 5.

More specifically, each column decoder 3 is constituted of a plurality of bit line selection transistors 41 and four word line selection circuit portions 42, as shown in FIG. 5. The bit line selection transistors 41 are constituted of p-channel transistors. Either the source regions or the drain regions of the bit line selection transistors 41 are connected to the corresponding bit lines 9, while either the drain regions or the source regions thereof are connected to the corresponding sense amplifiers 4. 16 bit lines 9 are connected to each sense amplifier 4 through the corresponding bit line selection transistors 41.

The gates of 16 bit line selection transistors 41 connected to the corresponding 16 bit lines 9 receive predecoding signals from 16 circuit portions 47 of the predecoder circuit 1 described later. Thus, one of the 16 bit line selection transistors 41 enters an ON-state, while the remaining 15 bit line selection transistors 41 are held in OFF-states. The bit line 9 connected to the bit line selection transistor 41 entering the ON-state is selected and electrically connected to the corresponding sense amplifier 4, while the bit lines 9 connected to the bit line selection transistors 41 held in the OFF-states are not electrically connected to the corresponding sense amplifier 4.

Eight sense amplifiers 4 are provided in correspondence to 128 bit lines 9. The aforementioned 16 bit lines 9 are connected to each of the eight sense amplifiers 4. A first four-input NAND circuit 45a receives outputs from four of the eight sense amplifiers 4, while a second four-input NAND circuit 45b receives outputs from the remaining four sense amplifiers 4. Outputs of the first and second four-input NAND circuits 45a and 45b are input in a NOR circuit 46, whose output is input in the corresponding output circuit 5.

Each word line selection circuit portion 42 is provided for selecting the word line 10 of the address corresponding to the predecoding signal received from the predecoder circuit 1. Further, each word line selection circuit portion 42 is provided every bit line group 13 (see FIG. 1) formed by 32 bit lines 9. This word line selection circuit portion 42 has a circuit structure formed by an inverter circuit 43 and a NOR circuit 44 serially connected with each other. The pair of gate lines 16 and 17 provided every bit line group 13 (see FIG. 1) receive an output of the inverter circuit 43. The NOR circuit 44 receives the predecoding signal from the corresponding circuit portion of the predecoder circuit 1 described later. This NOR circuit 44 receives the same signal as the predecoding signal input in the corresponding sense amplifier 4. In other words, a first input of the NOR circuit 44 of a prescribed word line selection circuit portion 42 receives the same predecoding signal as that input in the sense amplifier 4 linked to first 16 bit lines 9 corresponding to the word line 10 to be selected by the word line selection circuit portion 42. A second input of the NOR circuit 44 of the prescribed word line selection circuit portion 42 receives the same predecoding signal as that input in the sense amplifier 4 linked to second 16 bit lines 9 corresponding to the word line 10 to be selected by the word line selection circuit portion 42.

The predecoder circuit 1 is constituted of a circuit portion for supplying the predecoding signals to the bit line selection transistors 41 (see FIG. 5) shown in FIG. 6, another circuit portion for supplying the predecoding signals to the sense amplifiers 4 (see FIG. 5) shown in FIG. 7, and a row address predecoder circuit (not shown) supplying signals to the row decoders 2. As shown in FIG. 6, the circuit portion of the predecoder circuit 1 for supplying the predecoding signals to the bit line selection transistors 41 (see FIG. 5) is constituted of the 16 circuit portions 47 outputting the predecoding signals. Each of these circuit portions 47 has a circuit structure formed by a five-input NAND circuit 48 and two inverter circuits 49 and 50 serially connected with each other.

The five-input NAND circuit 48 receives the address enable signal AE, either a column address signal CA0 or an inverted column address signal /CA0, either a column address signal CA1 or an inverted column address signal /CA1, either a column address signal CA2 or an inverted column address signal /CA2 and either a column address signal CA3 or an inverted column address signal /CA3. An address input circuit (not shown) generates the column address signals CA0 to CA3 and the inverted column address signals /CA0 to /CA3 on the basis of the externally received address signal.

Depending on the combination of the aforementioned five signals (AE, CA0 or /CA0, CA1 or /CA1, CA2 or /CA2 and CA3 or /CA3) input in each five-input NAND circuit 48, the five-input NAND circuit 48 of one of the 16 circuit portions 47 outputs a low-level signal while the five-input NAND circuits 48 of the remaining circuit portions 47 output high-level signals. When all of the five signals input in any five-input NAND circuit 48 are at high levels, this five-input NAND circuit 48 outputs a low-level signal. When at least one of the five signals input in any five-input NAND circuit 48 is at a low level, on the other hand, this five-input NAND circuit 48 outputs a high-level signal. When any five-input NAND circuit 48 outputs a low-level signal, the corresponding circuit portion 47 outputs a low-level predecoding signal through the inverter circuits 49 and 50 thereof. When any five-input NAND circuit 48 outputs a high-level signal, on the other hand, the corresponding circuit portion 47 outputs a high-level predecoding signal through the inverter circuits 49 and 50 thereof. Thus, one of the 16 circuit portions 47 outputs a low-level predecoding signal, while the remaining 15 circuit portions 47 output high-level predecoding signals.

As shown in FIG. 7, the circuit portion for supplying the predecoding signals to the sense amplifiers 4 (see FIG. 5) is constituted of eight circuit portions 51 outputting predecoding signals. Each circuit portion 51 has a circuit structure formed by a four-input NAND circuit 52 and an inverter circuit 53 serially connected with each other. The four-input NAND circuit 52 receives the address enable signal AE, either a column address signal CA4 or an inverted column address signal /CA4, either a column address signal CA5 or an inverted column address signal /CA5 and either a column address signal CA6 or an inverted column address signal /CA6. The address input circuit (not shown) generates the column address signals CA4 to CA6 and the inverted column address signals /CA4 to /CA6 on the basis of the externally received address signal.

Depending on the combination of the aforementioned four signals (AE, CA4 or /CA4, CA5 or /CA5 and CA6 or /CA6) input in each four-input NAND circuit 52, the four-input NAND circuit 52 of one of the eight circuit portions 51 outputs a low-level signal while the four-input NAND circuits 52 of the remaining circuit portions 51 output high-level signals. When all of the four signals input in any four-input NAND circuit 52 are at high levels, this four-input NAND circuit 52 outputs a low-level signal. When at least one of the four signals input in any four-input NAND circuit 52 is at a low level, on the other hand, this four-input NAND circuit 52 outputs a high-level signal. When any four-input NAND circuit 52 outputs a high-level signal, the corresponding circuit portion 51 outputs a low-level predecoding signal through the inverter circuit 53 thereof. When any four-input NAND circuit 52 outputs a low-level signal, on the other hand, the corresponding circuit portion 51 outputs a high-level predecoding signal through the inverter circuit 53 thereof. Thus, one of the eight circuit portions 51 outputs a high-level predecoding signal, while the remaining seven circuit portions 51 output low-level predecoding signals.

A data read operation of the diode ROM according to the embodiment of the present invention is now described with reference to FIGS. 1, 2 and 5. The following read operation is described with reference to the column decoder 3, the sense amplifiers 4 and the output circuit 5 linked to the 128 bit lines 9 shown in FIG. 5.

According to this embodiment, the predecoder circuit 1 (see FIG. 1) externally receiving the address enable signal AE and the address signal outputs a predecoding signal to the row decoder 2, the column decoder 3 and the sense amplifiers 4.

Thus, the row decoder 2 supplies a low-level potential to the global word line 8 of the row address corresponding to the predecoding signal while supplying a high-level potential to the remaining global word lines 8. One of the four word line selection circuit portions 42 of the column decoder 3 (see FIG. 5) corresponding to the predecoding signal outputs a high-level block selection signal to the gate lines 16 and 17, while the remaining three word line selection circuit portions 42 output low-level block selection signals to the gate lines 16 and 17. Thus, the word line selection transistors 14 and 15 linked with the gate lines 16 and 17 receiving the high-level block selection signal enter ON-states, while the word line selection transistors 14 and 15 linked with the gate lines 16 and 17 receiving the low-level block selection signals enter OFF-states. The high- or low-level potential supplied from the row decoder 2 is supplied to the divided word lines 10 through the ON-state word line selection transistors 14 and 15, while no potential is supplied to the divided word lines 10 through the OFF-state word line selection transistors 14 and 15.

When the diode ROM selects the memory cell block 13*a* including a noted cell 12 shown in FIG. 1, for example, only the word line selection transistors 14 and 15 corresponding to this memory cell block 13*a* enter ON-states while the remaining word line selection transistors 14 and 15 enter OFF-states. Thus, the divided word lines 10 corresponding to the memory cell block 13*a* including the noted cell 12 are supplied with a high- or low-level potential while the divided word lines 10 corresponding to the remaining memory cell blocks 13*a* are supplied with no potential. The potential of a selected word line 10 corresponding to the noted cell 12 falls to a low level, while the potentials of nonselected word lines 10, included in the divided word lines 10 corresponding to the memory cell block 13*a* including the noted cell 12, rise to high levels. Since the n-type impurity regions 21 (see FIG. 2) functioning as the cathodes of the diodes 11 share the divided word lines 10, the potential of the n-type impurity region 21 serving as the cathode of the diode 11 of the noted cell 12 falls to a low level, while the potentials of nonselected n-type impurity regions 21, included in the n-type impurity regions 21 corresponding to the memory cell block 13*a* including the noted cell 12, rise to high levels. Assuming that the nonselected n-type impurity regions 21 (word lines 10) included in the n-type impurity regions 21 (word lines 10) corresponding to the memory cell block 13*a* including the noted cell 12 are supplied with a potential Vcc through the word line selection transistors 14 and 15 as the high-level potential, the diode ROM applies a potential obtained by subtracting the threshold voltage Vt of the word line selection transistors 14 and 15 from the potential Vcc to the nonselected n-type impurity regions 21 (word lines 10). In other words, the diode ROM applies a potential (Vcc-Vt) to the nonselected n-type impurity regions 21 (word lines 10) included in the n-type impurity regions 21 (word lines 10) corresponding to the memory cell block 13*a* including the noted cell 12.

The gate of one of the 16 bit line selection transistors 41 of the column decoder 3 connected to each group of 16 bit lines 9 shown in FIG. 5 receives a low-level predecoding signal, while the gates of the remaining 15 bit line selection transistors 41 receive high-level predecoding signals. Thus, the bit line selection transistor 41 receiving the low-level predecoding signal enters an ON-state, while the 15 bit line selection transistors 41 receiving the high-level predecoding signals enter OFF-states. The corresponding bit line 9 and the corresponding sense amplifier 4 are electrically connected with each other through the ON-state bit line selection transistor 41, while the bit lines 9 linked with the OFF-state bit line selection transistors 41 are not electrically connected to the corresponding sense amplifier 4. Since a bit line selection transistor 41 enters an ON-state every 16 bit line selection transistors 41, the bit lines 9 linked to the ON-state bit line selection transistors 41 are electrically connected to the eight sense amplifiers 4 respectively among the groups of 16 bit lines 9 connected to the eight sense amplifiers 4 through the bit line selection transistors 41 shown in FIG. 5 respectively.

One of the eight sense amplifiers 4 receives a high-level predecoding signal from the predecoder circuit 1 (see FIG. 1), while the remaining seven sense amplifiers 41 receive low-level predecoding signals from the predecoder circuit 1 (see FIG. 1). Thus, the sense amplifier 4 receiving the high-level predecoding signal is activated, while the seven sense amplifiers 4 receiving the low-level predecoding signals are inactivated. Inputs of the seven inactive sense amplifiers 4 are brought into open states, while outputs thereof go high. The activated sense amplifier 4 receives a data signal corresponding to data of the selected memory cell 12 through the corresponding bit line 9 electrically connected thereto. The sense amplifier 4 is a current sensing amplifier. When no current flows from the activated sense amplifier 4 to the corresponding bit line 9, the diode ROM outputs a high-level signal obtained by amplifying the data signal. When a current flows from the activated sense amplifier 4 to the corresponding bit line 9, on the other hand, the diode ROM outputs a low-level signal obtained by amplifying the data signal.

The first four-input NAND circuit 45*a* receives outputs of the active sense amplifier 4 and three of the inactive sense amplifiers 4, while the second four-input NAND circuit 45*b* receives outputs of the remaining four inactive sense amplifiers 4, for example. Thus, an output of the first four-input NAND circuit 45*a* depends on whether the level of a signal received from the active sense amplifier 4 is high or low. When receiving a high-level signal from the active sense amplifier 4, the first four-input NAND circuit 45*a*, receiving high-level signals from the three inactive sense amplifiers 4, outputs a low-level signal. When receiving a low-level signal from the active sense amplifier 4, on the other hand, the first four-input NAND circuit 45*a*, receiving high-level signals from the three inactive sense amplifiers 4, outputs a high-level signal.

The NOR circuit 46 receives the signals output from the first and second four-input NAND circuits 45*a* and 45*b*. When receiving low-level signals from the first and second four-input NAND circuits 45*a* and 45*b* respectively, the NOR circuit 46 outputs a high-level signal. When receiving high- and low-level signals from the first and second four-input NAND circuits 45*a* and 45*b* respectively, on the other hand, the NOR circuit 46 outputs a low-level signal. The diode ROM outputs this signal of the NOR circuit 46 through the output circuit 5.

According to this embodiment, as hereinabove described, the crosspoint memory cell array 6 is formed by arranging the memory cells 12 including the single diodes 11 respectively in the form of a matrix (crosspoint), whereby the memory cell size can be reduced as compared with a case where each memory cell 12 includes a single transistor.

According to this embodiment, the n-type impurity regions 21 functioning as the word lines 10 are divided every bit line group 13 formed by 32 bit lines 9 so that capacitances of the global word lines 8 can be inhibited from increase resulting from an increased length of the n-type impurity regions 21, whereby reduction of the rate of fall (rise) of the global word lines 8 can be suppressed.

According to this embodiment, the diode ROM supplies a low-level potential to the word line 10 corresponding to the selected memory cell 12 in the memory cell block 13a including the selected memory cell 12 while supplying high-level potentials to the word lines 10 other than that corresponding to the selected memory cell 12 in the memory cell block 13a including the selected memory cell 12 when accessing the selected memory cell 12, whereby no current substantially flows between the cathodes of the diodes 11 of the nonselected memory cells 12 linked with the selected bit line 9 included in the memory cell block 13a including the selected memory cell 12 and the bit line 9. Thus, the diode ROM can suppress such inconvenience that the same cannot determine data of the selected memory cell 12 until currents of all nonselected memory cells 12 linked to the selected bit line 9 completely flow when the anode of the diode 11 of the selected memory cell 12 and the selected bit line 9 are not connected with each other. Consequently, the data read time can be reduced.

According to this embodiment, the n-type impurity regions 21 function also as either the source regions or the drain regions of the word line selection transistors 14 and 15 so that neither source regions nor drain regions of the word line selection transistors 14 and 15 may be separately formed, whereby the layout of the diode ROM can be simplified.

According to this embodiment, the low-concentration impurity regions 21a are so formed as to extend toward the portions close to the gate lines 16 and 17 of the word line selection transistors 14 and 15, whereby the diode ROM can suppress field concentration around the gate lines 16 and 17.

According to this embodiment, 32 p-type impurity regions 22 are formed in each n-type impurity region 21 at the prescribed interval, whereby the diodes 11 can be easily arranged in the form of a matrix (crosspoint).

According to this embodiment, the global word lines 8, so formed as to extend along the extensional direction of the word lines 10 (n-type impurity regions 21), can be easily connected to either the drain regions or the source regions of the word line selection transistors 14 and 15.

According to this embodiment, the global word lines 8, provided above the bit lines 9, can be easily so formed as to extend along the extensional direction of the word lines 10 (n-type impurity regions 21).

According to this embodiment, the n-type low-concentration impurity regions 23a are so formed as to extend toward the portions close to the gate lines 16 and 17 of the word line selection transistors 14 and 15, whereby the diode ROM can suppress field concentration around the gate lines 16 and 17.

According to this embodiment, the n-type contact regions 23c are formed for reducing contact resistance upon connection between the plugs 31 and the impurity regions 23, whereby the global ROM can suppress reduction of the rate of fall (rise) of the global word lines 8 resulting from increased contact resistance.

According to this embodiment, the word line selection transistors 14 and 15 share the impurity regions 23 so that the impurity regions 23 can be employed as either the drain regions or the source regions common to the word line selection transistors 14 and 15, whereby either the drain regions or the source regions may not be individually formed on the word line selection transistors 14 and 15. Thus, the layout of the diode ROM can be simplified also according to this structure.

According to this embodiment, the diode ROM is provided with the gate line 16 (17) functioning as a common gate electrode of the plurality of word line selection transistors 14 (15) provided in correspondence to the prescribed memory cell block 13a for activating the prescribed memory block 13a including the selected memory cell 12 without individually turning on the plurality of word line selection transistors 14 (15) by activating the corresponding memory cell block 13a by supplying the block selection signal to the gate line 16 (17) thereby simultaneously turning on the plurality of corresponding word line selection transistors 14 (15), whereby control of the plurality of word line selection transistors 14 (15) can be simplified.

According to this embodiment, the word line selection transistors 14 and 15 are formed on both ends of each of the divided word lines 10 (n-type impurity regions 21), whereby the diode ROM can easily supply high- or low-level potentials to the word lines 10 (n-type impurity regions 21) from the global word lines 8 through the word line selection transistors 14 and 15.

Although the present invention has been described and illustrated in detail, it is clearly understood that the same is by way of illustration and example only and is not to be taken by way of limitation, the spirit and scope of the present invention being limited only by the terms of the appended claims.

For example, the present invention is applied to the crosspoint diode ROM in the aforementioned embodiment, the present invention is not restricted to this but is also widely applicable to a memory other than the crosspoint diode ROM.

While the pair of (two) selection transistors are arranged on both ends of each word line 10 in the aforementioned embodiment, the present invention is not restricted to this but each selection transistor may alternatively be arranged on either end of each word line 10.

While each bit line group is constituted of 32 bit lines in the aforementioned embodiment, the present invention is not restricted to this but each bit line group may alternatively be constituted of bit lines of a number other than 32.

What is claimed is:

1. A memory comprising:
    a plurality of memory cells including diodes;
    a plurality of bit lines; and
    a first conductive type first impurity region arranged to intersect with said bit lines for functioning as first electrodes of said diodes included in said memory cells and a word line, wherein
    said first impurity region is divided every bit line group formed by a prescribed number of said bit lines along a direction intersecting with the extensional direction of said first impurity region.

2. The memory according to claim 1, wherein
    said plurality of memory cells are arranged on the intersections between said divided first impurity region and said plurality of bit lines respectively, and
    said memory cells arranged on the intersections between said prescribed number of bit lines included in prescribed said bit line group and said first impurity region corresponding to said prescribed bit line group constitute a memory cell block,
    so that said memory supplies a first potential to said first impurity region corresponding to selected said memory cell in said memory cell block including said selected memory cell while supplying a second potential to said first impurity region other than said first impurity region corresponding to said selected memory cell in said memory cell block including said selected memory cell when accessing said selected memory cell.

3. The memory according to claim 2, further comprising a selection transistor provided every said divided first impurity region for selecting said first impurity region corresponding to said memory cell block including said selected memory cell and supplying said first potential or said second potential, wherein said first impurity region functions as either the source region or the drain region of said selection transistor.

4. The memory according to claim 3, wherein
said first impurity region includes a first conductive type second impurity region having a first impurity concentration and a first conductive type third impurity region having a second impurity concentration higher than said first impurity concentration, and
said second impurity region is formed shallower than said third impurity region to extend toward a portion close to the gate electrode of said selection transistor.

5. The memory according to claim 4, further comprising a plurality of second conductive type fourth impurity regions formed at least on the surface of said first conductive type second impurity region at a prescribed interval for functioning as second electrodes of said diodes.

6. The memory according to claim 5, further comprising a second wire connected to said fourth impurity region, wherein
said memory cells include a first memory cell having a third wire for connecting said second wire and said bit lines with each other and a second memory cell having no said third wire.

7. The memory according to claim 3, further comprising:
a fifth impurity region functioning as either the drain region or the source region of said selection transistor, and
a first wire connected to said fifth impurity region for supplying said first potential or said second potential when accessing said memory cell.

8. The memory according to claim 7, wherein
said first wire is so formed as to extend along the extensional direction of said first impurity region.

9. The memory according to claim 8, wherein
said first wire is formed above said bit lines.

10. The memory according to claim 7, wherein
said fifth impurity region includes a first conductive type sixth impurity region having a third impurity concentration and a first conductive type seventh impurity region having a fourth impurity concentration higher than said third impurity concentration, and
said sixth impurity region is formed shallower than said seventh impurity region to extend toward a portion close to the gate electrode of said selection transistor.

11. The memory according to claim 10, wherein
said seventh impurity region is formed with a first conductive type contact region for reducing contact resistance between said seventh impurity region and said first wire.

12. The memory according to claim 10, wherein
said first impurity region includes a first conductive type second impurity region having a first impurity concentration and a first conductive type third impurity region having a second impurity concentration higher than said first impurity concentration, and
said fourth impurity concentration of said seventh impurity region is higher than said second impurity concentration of said third impurity region.

13. The memory according to claim 7, wherein
said selection transistor includes a first selection transistor and a second selection transistor for selecting two adjacent said first impurity regions respectively, and
said first selection transistor and said second selection transistor share said fifth impurity region.

14. The memory according to claim 13, further comprising:
a first gate line provided to extend along a direction intersecting with the extensional direction of said first impurity region for functioning as a common gate electrode of a plurality of said first selection transistors provided in correspondence to prescribed said memory cell block, and
a second gate line provided to extend along said direction intersecting with the extensional direction of said first impurity region for functioning as a common gate electrode of a plurality of said second selection transistors provided in correspondence to said memory cell block adjacent to said prescribed memory cell block,
for activating corresponding said memory cell block by supplying a block selection signal to said first gate line or said second gate line thereby turning on corresponding said first selection transistors or corresponding said second selection transistors.

15. The memory according to claim 3, wherein
said selection transistor includes a third selection transistor and a fourth selection transistor formed in the vicinity of both ends of the extensional direction of said first impurity region to hold said first impurity region therebetween.

16. The memory according to claim 15, further comprising:
a third gate line provided to extend along a direction intersecting with the extensional direction of said first impurity region for functioning as a common gate electrode of a plurality of said third selection transistors provided in correspondence to prescribed said memory cell block, and
a fourth gate line provided to extend along said direction intersecting with the extensional direction of said first impurity region for functioning as a common gate electrode of a plurality of said fourth selection transistors provided in correspondence to said prescribed memory cell block,
for activating said prescribed memory cell block by supplying a block selection signal to said third gate line and said fourth gate line thereby turning on corresponding said third selection transistors and corresponding said fourth selection transistors.

17. The memory according to claim 1, further comprising a bit line selection transistor connected to said bit lines,
for turning on said bit line selection transistor connected to the corresponding one of said bit lines connected with selected said memory cell when accessing said selected memory cell.

* * * * *